(12) United States Patent
Yokoyama et al.

(10) Patent No.: US 12,354,901 B2
(45) Date of Patent: Jul. 8, 2025

(54) STAGE AND MANUFACTURING METHOD THEREOF

(71) Applicant: NHK SPRING CO., LTD., Yokohama (JP)

(72) Inventors: Hibiki Yokoyama, Yokohama (JP); Naoya Kida, Yokohama (JP); Jun Futakuchiya, Yokohama (JP); Noriyoshi Kaneda, Yokohama (JP); Michiyoshi Sone, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 385 days.

(21) Appl. No.: 18/176,749

(22) Filed: Mar. 1, 2023

(65) Prior Publication Data

US 2023/0207286 A1    Jun. 29, 2023

Related U.S. Application Data

(63) Continuation of application No. PCT/JP2021/029390, filed on Aug. 6, 2021.

(30) Foreign Application Priority Data

Sep. 8, 2020 (JP) ................. 2020-150843

(51) Int. Cl.
- *H01L 21/683* (2006.01)
- *C23C 4/11* (2016.01)
- *H01J 37/32* (2006.01)

(52) U.S. Cl.
CPC ............ *H01L 21/6833* (2013.01); *C23C 4/11* (2016.01); *H01J 37/32715* (2013.01)

(58) Field of Classification Search
CPC ............ H01L 21/6831; H01L 21/6833; H01L 21/68785; C23C 4/11
See application file for complete search history.

(56) References Cited

U.S. PATENT DOCUMENTS

| 5,909,354 A | 6/1999 | Harada et al. |
| 2008/0266745 A1 | 10/2008 | Nobori et al. |

(Continued)

FOREIGN PATENT DOCUMENTS

| JP | 08-158034 A | 6/1996 |
| JP | 2600558 Y | 10/1999 |

(Continued)

OTHER PUBLICATIONS

Translation of KR 2008-0014673A. Feb. 14, 2008. (Year: 2008).*

(Continued)

*Primary Examiner* — Rexford N Barnie
*Assistant Examiner* — Christopher J Clark
(74) *Attorney, Agent, or Firm* — NKL Law; Jae Youn Kim

(57) ABSTRACT

A stage includes a base material including a step portion and an insulating film. The step portion includes a first surface recessed from a top surface of the base material and a second surface recessed from a side surface of the base material. The insulating film includes a plurality of first layers on the first surface and a plurality of second layers on the second surface. In the step portion, each first end portion of the plurality of first layers and each second end portion of the plurality of second layers are alternately stacked. The first surface and the second surface are connected via a corner, and each first end portion and each second end portion are alternately stacked at the corner.

22 Claims, 13 Drawing Sheets

(56) References Cited

U.S. PATENT DOCUMENTS

| | | | |
|---|---|---|---|
| 2013/0134148 A1 | 5/2013 | Tachikawa et al. | |
| 2018/0190501 A1 | 7/2018 | Ueda | |
| 2019/0013230 A1* | 1/2019 | Taga | H01L 21/68757 |
| 2021/0398839 A1* | 12/2021 | Hanamachi | C23C 4/134 |
| 2023/0339059 A1* | 10/2023 | Moriya | H01L 21/6831 |

FOREIGN PATENT DOCUMENTS

| | | | | | |
|---|---|---|---|---|---|
| JP | 2002-299425 A | 10/2002 | | | |
| JP | 2007-009277 A | 1/2007 | | | |
| JP | 2007-027315 A | 2/2007 | | | |
| JP | 200710269 A | 3/2007 | | | |
| JP | 2008047881 A | 2/2008 | | | |
| JP | 2014-013874 A | 1/2014 | | | |
| JP | 6027407 B2 | 11/2016 | | | |
| JP | 2018-110216 A | 7/2018 | | | |
| JP | 2019-016697 A | 1/2019 | | | |
| JP | 2019-016704 A | 1/2019 | | | |
| KR | 20080014673 A | * | 2/2008 | ......... | H01L 21/6833 |
| KR | 10-2019-0005798 A | | 1/2019 | | |

OTHER PUBLICATIONS

Office Action dated Jul. 3, 2024 issued in KR Appl. No. 10-2023-7007541.

ISR (PCT/ISA/210) dated Oct. 19, 2021 issued in PCT/JP2021/029390.

WO—ISA (PCT/ISA/237) dated Oct. 19, 2021 issued in PCT/JP2021/029390.

English translation of Written Opinion of the International Searching Authority on Oct. 19, 2021 for the PCT application No. PCT/JP2021/029390.

EESR dated May 15, 2024 issued in EP Appl. No. 21866441.5.

* cited by examiner

STAGE AND MANUFACTURING METHOD THEREOF

CROSS-REFERENCE TO RELATED APPLICATIONS

This application is a Continuation of International Patent Application No. PCT/JP2021/029390, filed on Aug. 6, 2021, which claims the benefit of priority to Japanese Patent Application No. 2020-150843, filed on Sep. 8, 2020, the entire contents of which are incorporated herein by reference.

FIELD

An embodiment of the present invention relates to a stage and a manufacturing method thereof, for example, a stage for placing a substrate and a manufacturing method thereof.

BACKGROUND

Semiconductor devices are installed in almost all electronic devices and play an important role for the functions of the electronic devices. Semiconductor devices utilize semiconductor characteristics possessed by silicon, etc. Semiconductor devices are constructed by stacking a semiconductor film, an insulating film, and a conductive film on a substrate and patterning these films. These films are stacked by vapor deposition, sputtering, chemical vapor phase deposition (CVD), or substrate chemical reactions, and are patterned by a photolithography process. The photolithography process includes the formation of a resist on the films that are subjected to patterning, the exposure of the resist, the formation of a resist mask by development, the partial removal of these films by etching, and the removal of the resist mask.

The characteristics of the films described above depend largely on the conditions for forming the films or the conditions for patterning. One of the above conditions is a voltage applied to a mounting table (hereinafter referred to as stage) for installing a substrate. For example, the voltage applied to the stage included in an etching device has been increasing with the miniaturization of recent semiconductor devices, since the ratio of the diameter of a hole to be processed to the thickness of the film to be processed has increased. As the voltage applied to the stage increases, withstand voltages of members included in the stage need to be improved. The members included in the stage may be, for example, a cooling plate and an electrostatic chuck, or the like. For example, Japanese Patent No. 6027407 and Japanese Registered Utility Model No. 2600558 disclose a stage in which an insulating film is formed on the surface of the stage by using a thermal spraying method to improve the withstand voltage.

SUMMARY

A stage according to an embodiment of the present invention includes a base material including a step portion and an insulating film. The step portion includes a first surface recessed from a top surface of the base material and a second surface recessed from a side surface of the base material. The insulating film includes a plurality of first layers on the first surface and a plurality of second layers on the second surface. In the step portion, each first end portion of the plurality of first layers and each second end portion of the plurality of second layers are alternately stacked.

A manufacturing method of a state according to an embodiment of the present invention includes the steps of forming a first layer by thermal spraying from a thermal spraying machine on a first surface recessed from a top surface of a base material while moving the thermal spraying machine along a plane substantially parallel to the top surface of the base material, and forming a second layer by thermal spraying from the thermal spraying machine on a second surface recessed from a side surface of the base material while moving the thermal spraying machine along a plane substantially parallel to the side surface of the base material. A cycle including the steps is performed at least twice. An insulating film is formed in which a first end portion of the first layer and a second end portion of the second layer are alternately stacked on a step portion including the first surface and the second surface of the base material.

The cycle may further include a step including forming a third layer by thermal spraying from the thermal spraying machine on a bottom surface of the base material while moving the thermal spraying machine along a plane substantially parallel to the bottom surface of the base material.

The manufacturing method of a stage may further include a step comprising forming a third layer by thermal spraying from the thermal spraying machine on a bottom surface of the base material while moving the thermal spraying machine along a plane substantially parallel to the bottom surface of the base material, separately from the cycle.

In the cycle, at least one of the step of forming the first layer and the step of forming the second layer may be performed multiple times.

In at least one of the step of forming the first layer and the step of forming the second layer, the thermal spraying machine may move in only one direction to thermally spray.

In at least one of the step of forming the first layer and the step of forming the second layer, the thermal spraying machine may move in a zigzag manner to thermally spray.

The first surface and the second surface may be connected via a corner, and the first end portion and the second end portion may be alternately stacked at the corner. A thickness of the insulating film at the corner may be greater than or equal to 100% and less than or equal to 200% of each of a thickness of the insulating film on the first surface and a thickness of the insulating film on the second surface.

The first end portion may be provided so as to rise in a convex shape and incline with respect to the first surface. The second end portion may be provided so as to rise in a convex shape and incline with respect to the second surface.

A cross-sectional shape of the corner in a plane perpendicular to the first surface and the second surface may include a curved shape.

At least one of the plurality of first layers and the plurality of second layers may include a stacked structure.

The base material may include a channel for liquid flow.

An electrostatic chuck may be provided over the insulating film on the top surface of the base material.

DESCRIPTION OF EMBODIMENTS

Figure 1A:
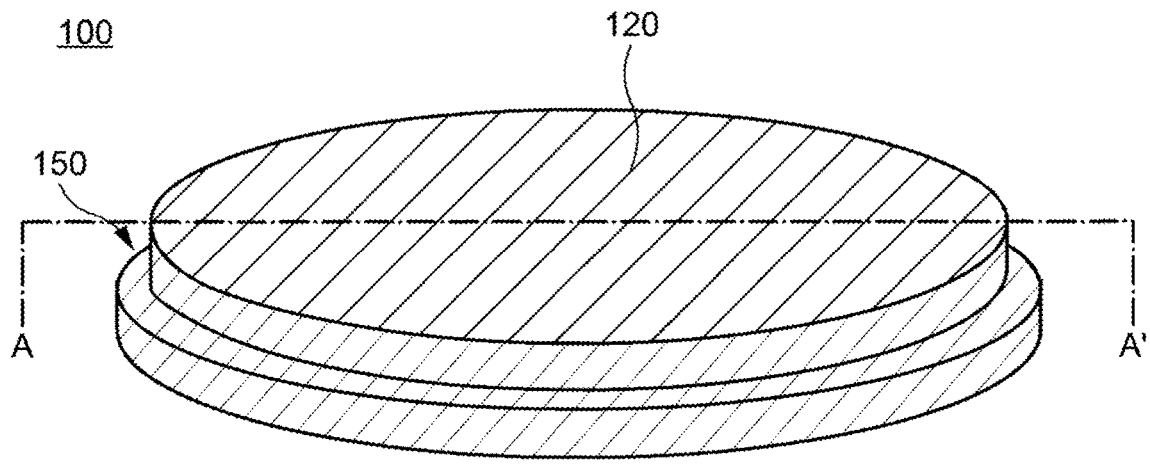
FIG. 1A is a schematic perspective view of a stage according to an embodiment of the present invention.

According to the conventional thermal spraying method, after a film having a predetermined thickness is formed on one surface, the thermal spraying machine is moved to form a film having a predetermined film thickness on another surface. In this thermal spraying method, it is difficult for the thermal spray material to adhere to the boundary between the two surfaces to be thermally sprayed (hereinafter, may be referred to as a joint, a corner, or a nock corner) and there is a problem that gaps or voids are generated. When the gaps or voids are generated at the corner, the withstand voltage (also called breakdown voltage) of the film is reduced. A method of suppressing the generation of the gaps or the voids at the corner is to thermally spray the corners directly. For example, when the thermal spraying machine is continuously moved from one surface to the other surface, thermal spraying can be performed at the corner and the generation of gaps or voids at the corner can be suppressed. However, this method has a problem that the film thickness at the corner becomes larger than the film thickness on the two surfaces. As the thickness of the film formed at the corner increases, the adhesion strength of the film at the corner decreases, resulting in a decrease in the reliability of the stage. Therefore, in the manufacturing process of the stage by the thermal spraying method, it has been desirable to control not only the film formed on the surface but also the film formed at the corner to have a predetermined thickness (that is, to form a uniform film thickness) and to improve the adhesion strength and withstand voltage of the film.

Since a stage according to an embodiment of the present invention includes an insulating film with improved adhesion strength and withstand voltage, it has excellent insulating properties and reliability.

Hereinafter, embodiments of the invention disclosed in the present application will be described with reference to the drawings. However, the present invention can be implemented in various forms without departing from the gist thereof and should not be construed as being limited to the description of the following exemplary embodiments.

For the sake of clarity of description, the drawings may be schematically represented with respect to widths, thicknesses, shapes, and the like of the respective portions compared with actual embodiments. However, they are merely an example and do not limit the interpretation of the present invention. In this specification and the respective drawings, components having the same functions as those described with reference to the preceding drawings are denoted by the same reference numerals, and a duplicate description thereof may be omitted.

In the present invention, when a single film is processed to form a plurality of films, this plurality of films may have different functions and roles. However, this plurality of films is derived from films formed as the same layer in the same process and has the same layer structure and the same material. Therefore, the plurality of films is defined as existing in the same layer.

In this specification and the drawings, when multiple portions of one configuration are distinguished, the same reference numerals are used, and a hyphen and a natural number or lowercase letters of the alphabet may be used.

First Embodiment

A configuration of a stage 100 and a method for manufacturing a stage 100 according to an embodiment of the present invention are described with reference to FIGS. 1A to 7B.

[1. Configuration of Stage 100]

Figure 1B:
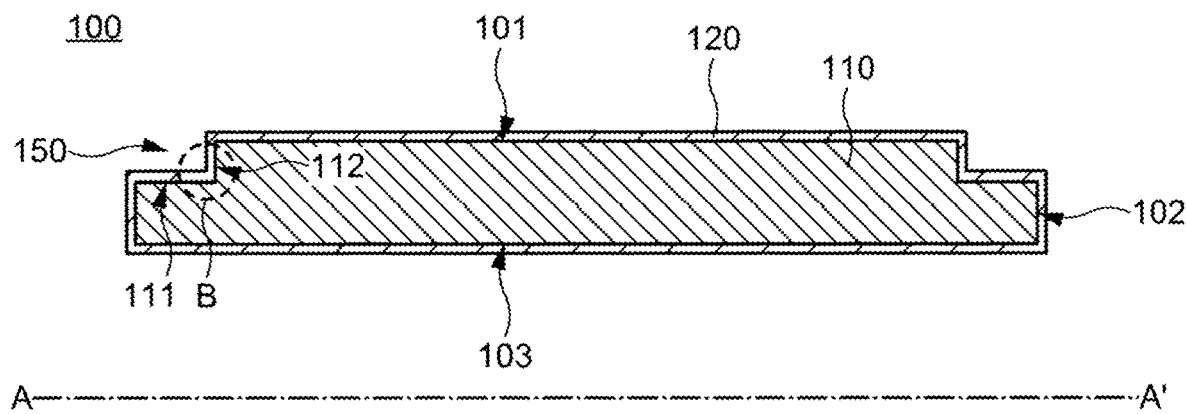
FIG. 1B is a schematic cross-sectional view of a stage according to an embodiment of the present invention.

FIGS. 1A and 1B are a schematic perspective view and a cross-sectional view of a stage 100, respectively, according to an embodiment of the present invention. Specifically, FIG. 1A is a schematic perspective view of the stage 100, and FIG. 1B is a schematic cross-sectional view of the stage 100 cut along the line A-A' shown in FIG. 1A.

As shown in FIGS. 1A and 1B, the stage 100 includes a base material 110 and an insulating film 120. The insulating film 120 is provided so as to cover a top surface 101, a side surface 102, and a bottom surface 103 of the base material 110. The insulating film 120 may be provided so as to cover the entire of the top surface 101, the side surface 102, or the bottom surface 103 of the base material 110, and may cover a part of the top surface 101, the side surface 102, or the lower surface 103 of the base material 110.

The base material 110 has a structure in which two circular flat plates of different sizes are combined. That is, the base material 110 has a structure in which a small circular flat plate is located on a large circular flat plate. The base material 110 may be configured by joining two members (the large circular flat plate and the small circular flat plate), or may be configured by one member. In other words, the base material 110 has a step portion 150 including a first surface 111 recessed from the top surface 101 (or a surface extending the top surface 101) and a second surface 112 recessed from the side surface 102 (or a surface extending the side surface 102). It can also be said that the outer periphery of the base material 110 includes the step portion 150 including the first surface 111 and the second surface 112. The insulating film 120 is also provided on the first surface 111 and the second surface 112 of the step portion 150.

A surface extending the top surface 101 of the base material 110 and a surface extending the second surface 112, a surface extending the side surface 102 of the base material 110 and a surface extending the first surface 111, a surface extending the first surface 110 and a surface extending the second surface 112, and a surface extending the side surface 102 of the base material 110 and a bottom surface 103 of the base material 110 are provided so as to intersect at approximately 90°, for example. The angle at which the surfaces intersect each other is not limited to this angle. Here, approximately 90° means the vicinity of 90°, for example, greater than or equal to 80° and less than or equal to 100°.

Each corner between the top surface 101 of the base material 110 and the second surface 112, a corner between the side surface 102 of the base material 110 and the first surface 111, a corner between the first surface 111 and the second surface 112, and a corner between the side surface 102 of the base material 110 and the bottom surface 103 of the base material 110 may be a C-chamfered corner or nock corner or an R-chamfered corner or nock corner. That is, the first surface 111 and the second surface 112 may be connected via a nock corner. In this case, the cross-sectional shape of the nock corner on the plane perpendicular to the first surface 111 and the second surface 112 has a linear shape or a curved shape. The same configuration is applied to the corner between the top surface 101 of the base material 110 and the second surface 112, the corner between the side surface 102 of the base material 110 and the first surface 111, and the corner between the side surface 102 of the base material 110 and the bottom surface 103 of the base material 110.

Metal or ceramics can be used as the material of the base material 110. More specifically, titanium (Ti), aluminum (Al), stainless steel, or oxides containing these materials can be used as the material of the base material 110.

A material that satisfies desired withstand voltage characteristics and can be thermally sprayed by a thermal spraying method can be used for the insulating film 120. For example, oxides containing at least one element selected from alkaline earth metals, rare earth metals, aluminum (Al), tantalum (Ta), and silicon (Si) can be used as the material of the insulating film 120. More specifically, aluminum oxide (Al2O3), magnesium oxide (MgO), or the like can be used as the material of the insulating film 120.

The insulating film 120 may include an inorganic insulator. For example, aluminum oxide, titanium oxide, chromium oxide, zirconium oxide, magnesium oxide, yttrium oxide, or composite oxides thereof can be used as the inorganic insulator.

A configuration of the step portion 150 is described in detail with reference to FIG. 2.

Figure 2:
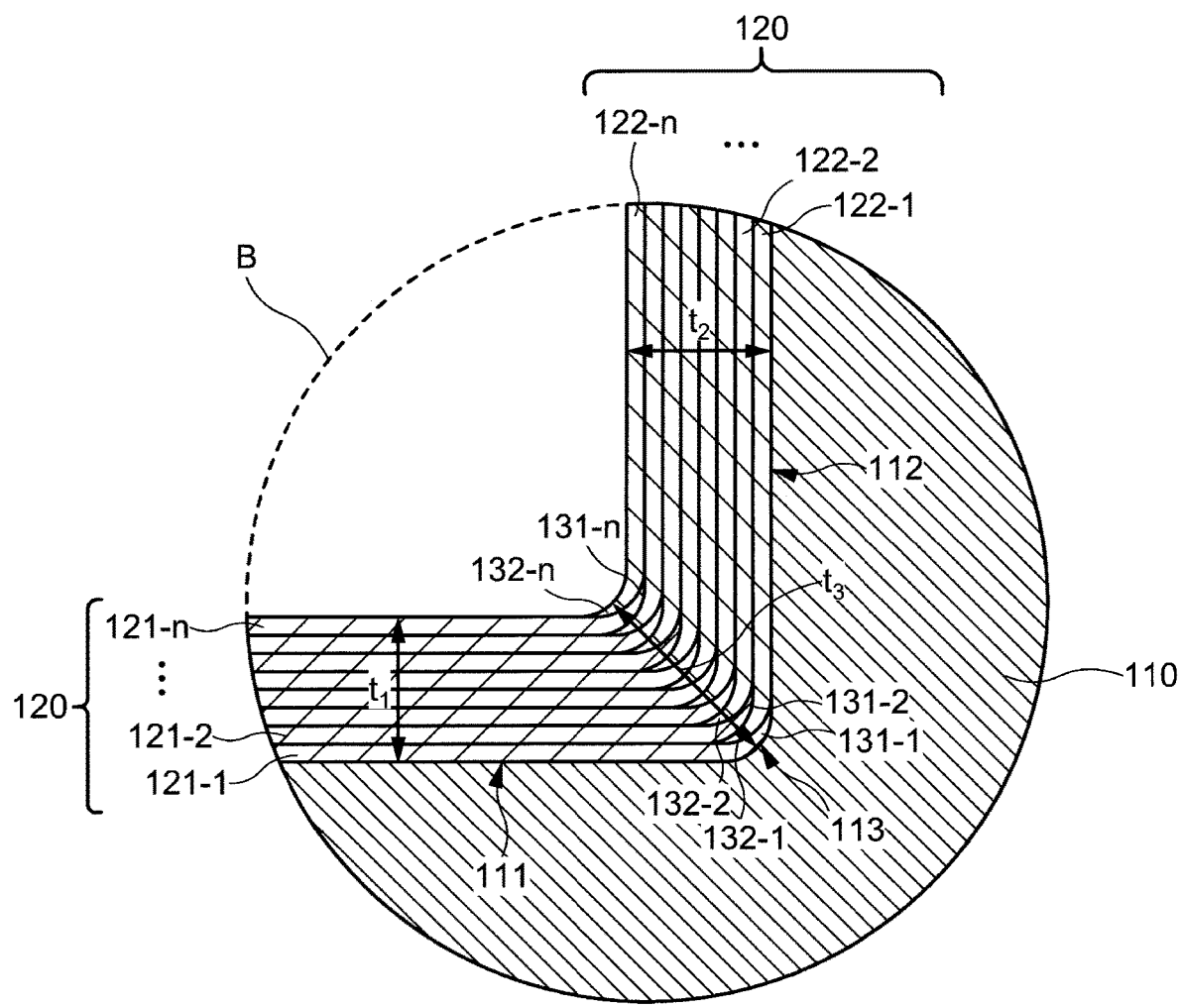
FIG. 2 is a schematic cross-sectional view showing an enlarged part of a step portion of a stage according to an embodiment of the present invention.

FIG. 2 is a schematic cross-sectional view showing an enlarged part of the step portion 150 of the stage 100 according to an embodiment of the present invention. Specifically, FIG. 2 is an enlarged cross-sectional view of a region B shown in FIG. 1B.

As shown in FIG. 2, in the step portion 150, the first surface 111 and second surface 112 are connected via a corner 113. The insulating film 120 on the first surface 111 includes a plurality of first layers 121. That is, stacked first layers 121-1, 121-2, ..., 121-$n$ are provided on the first surface 111. Similarly, the insulating film 120 on the second surface 112 includes a plurality of second layers 122. That is, stacked second layers 122-1, 122-2, ..., 122-$n$ are provided on the second surface 112. The number of first layers 121 and the number of second layers 122 are not particularly limited.

In the step portion 150, the insulating film 120 is a film continuously formed at the corner 113 by contacting the plurality of first layers 121 and the plurality of second layers 122. The first layers 121-1, 121-2, ..., 121-$n$ have first end portions 131-1, 131-2, ..., 131-$n$. Similarly, the second layers 122-1, 122-2, ..., 122-$n$ have second end portions 132-1, 132-2, ..., 131-$n$. The first end portions 131 and the second end portions 132 are alternately stacked at the corner portion 113. At the corner 113, the first end portions 131 are provided so as to rise in a convex shape with respect to the first surface 111 and incline with respect to the first surface 111. Similarly, at the corner 113, the second end portions 132 are provided so as to rise in a convex shape with respect to the second surface 112 and incline with respect to the second surface 112. As shown in FIG. 2, when the corner 113 of the step portion 150 is a R-chamfered nock corner (that is, when the cross-sectional shape of the corner 113 has a curved shape), the curvature radius of the first end portion 131 and the curvature radius of the end portion 132 are preferably larger than the curvature radius of the corner portion 113 (radius of R chamfering). Here, the curvature radius of the corner 113 is, for example, greater than or equal to 0.1 mm and less than or equal to 10 mm.

Further, the same configuration is applied to the corner 113 of the step portion 150 which is a C-chamfered nock corner (that is, when the cross-sectional shape of the corner has a linear shape). In this case, the curvature radius of the first end portion 131 and the curvature radius of the second end portion are preferably larger than the dimension of the C chamfer of the corner 113. Here, the dimension of the chamfer of the corner 113 is, for example, greater than or equal to 0.1 mm and less than or equal to 10 mm.

In FIG. 2, although the first end portion 131-1 is in contact with the corner 113 and the second end portion 132-1 is in contact with the first end portion 131-1, the configuration of the corner 113 is not limited to this configuration. The second end portion 132-1 may be in contact with the corner 113 and the first end portion 131-1 may be in contact with the second end portion 132-1.

The thickness t1 of the insulating film 120 on the first surface 111 (that is, the thickness of the plurality of first layers 121) and the thickness t2 of the insulating film 120 on the second surface 112 (that is, the thickness of the plurality of second layers 122) are, for example, greater than or equal to 50 μm and less than or equal to 1500 μm. The thickness t3 of the insulating film 120 at the corner 113 is 100% to 200% of each of the thickness t1 of the insulating film 120 on the first surface 111 and the thickness t2 of the insulating film 120 on the second surface 112, preferably 100% to 150%, more preferably 100% to 130%.

The thickness of the first layer 121 and the thickness of the second layer 122 may be the same or different.

In the stage 100 according to the present embodiment, the thickness t3 of the insulating film 120 at the corner 113 of the step portion 150 is controlled to be 100% to 200% of each of the thickness t1 of the insulating film 120 on the first surface 111 and the thickness t2 of the insulating film 120 on the second surface 112, so that the decrease in adhesion strength of the insulating film 120 at the corner 113 is suppressed. That is, the insulating film 120 at the corner 113 has the same adhesion strength as the insulating film 120 on the first surface 111 and the second surface 112. In addition, in the step portion 150, the insulating film 120 has a uniform thickness and does not contain large gaps or voids. In particular, since the insulating film 120 at the corner portion 113 has a structure in which the first end portions 131 of the first layers 121 and the second end portions 132 of the second layers 122 are alternately stacked, the insulating film 120 at the corner 113 is a dense film and is less likely to contain large gaps or voids. Thus, the withstand voltage of the insulating film 120 is improved. Therefore, the stage 100 according to the present embodiment includes the insulating film 120 with improved adhesion strength and withstand voltage, and has excellent insulating properties and reliability.

[2. Manufacturing Method of Stage 100]

Figure 3:
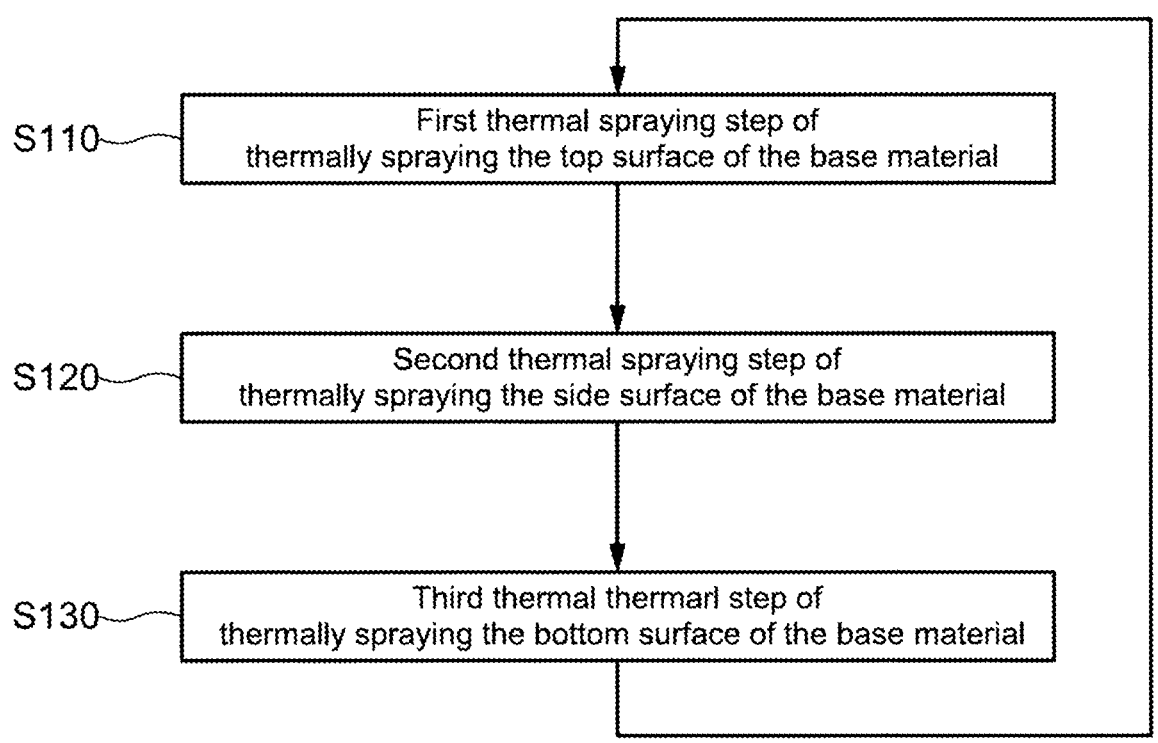
FIG. 3 is a flow chart showing a method for manufacturing a stage according to an embodiment of the present invention.

FIG. 3 is a flow chart showing a method for manufacturing the stage 100 according to an embodiment of the invention. Specifically, FIG. 3 is a flow chart of a thermal spraying process, which is one of the manufacturing processes of the stage 100.

As shown in FIG. 3, the method for manufacturing the stage 100 includes a first thermal spraying step of thermally spraying the top surface 101 of the base material 110 (S110), a second thermal spraying step of thermally spraying the side surface 102 of the base material 110 (S120), and a third thermal spraying step of thermally spraying the bottom surface 103 of the base material 110 (S130). The stage 100 according to the present embodiment is manufactured by repeating the first thermal spraying step (S110), the second thermal spraying step (S120), and the third thermal spraying step (S130).

For example, a localoid thermal spraying method, a plasma thermal spraying method, or a thermal spraying method combining these methods can be used as the thermal spraying method in the present specification.

Figure 4:
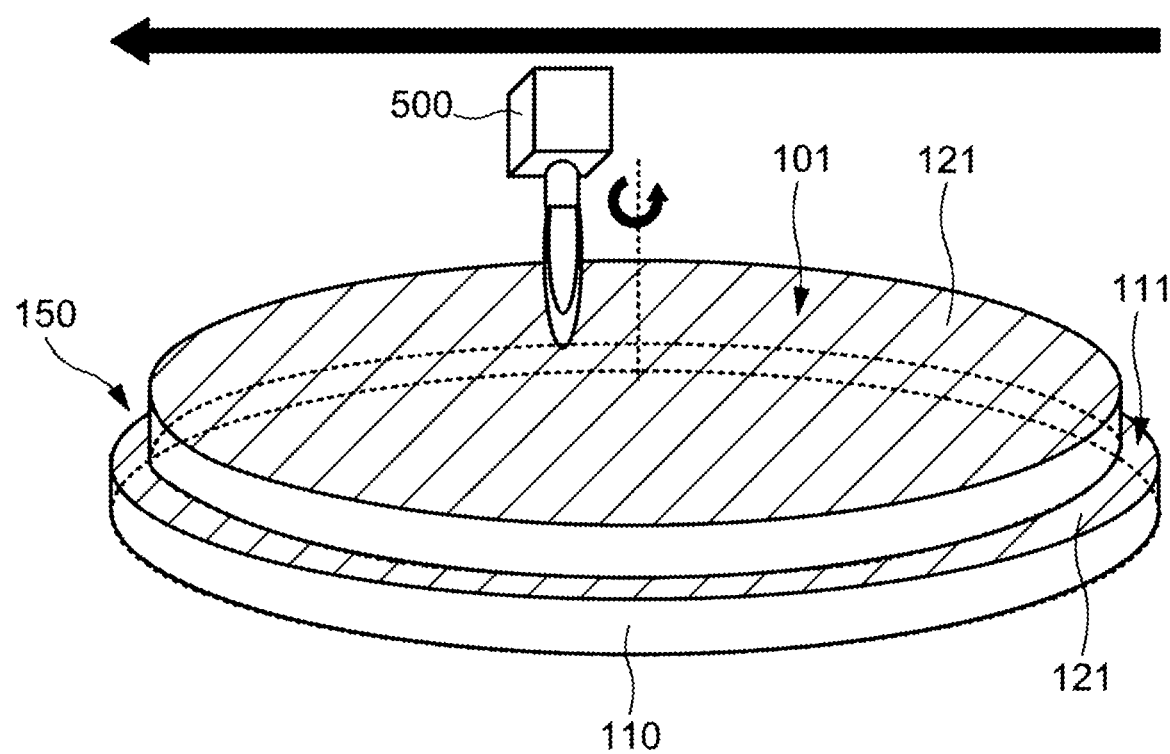
FIG. 4 is a schematic perspective view explaining a first thermal spraying step in a method for manufacturing a stage according to an embodiment of the present invention.
Figure 5:
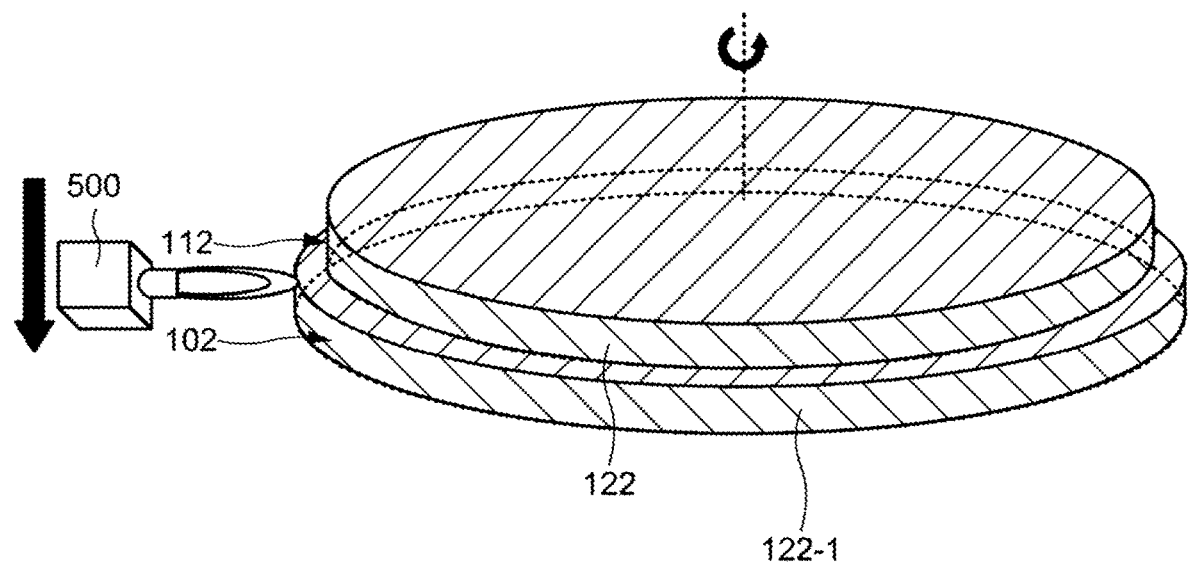
FIG. 5 is a schematic perspective view explaining a second thermal spraying step in a method for manufacturing a stage according to an embodiment of the present invention.
Figure 6:
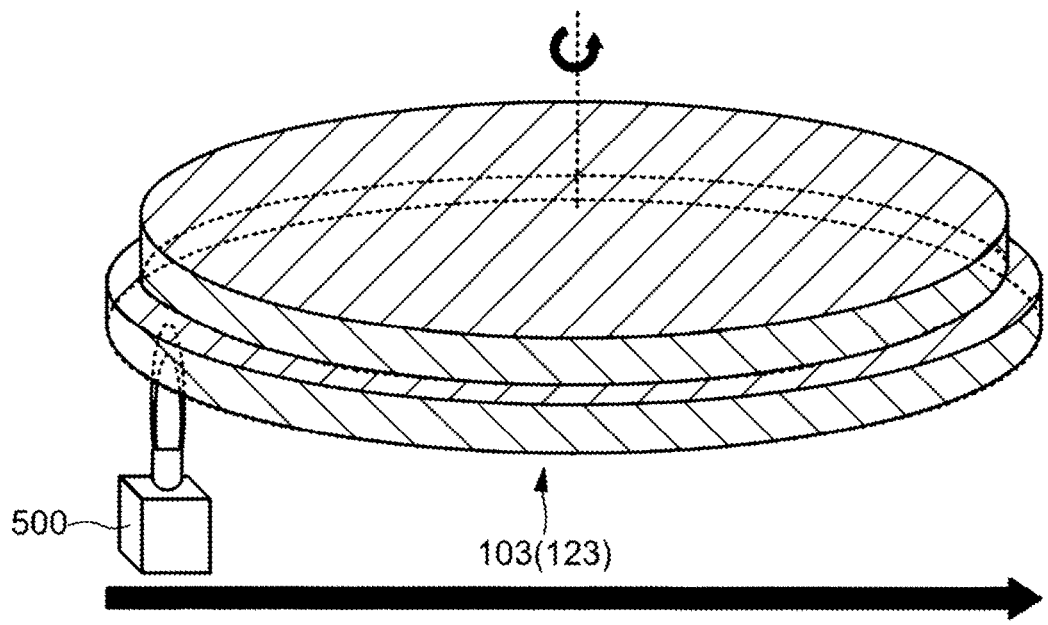
FIG. 6 is a schematic perspective view explaining a third thermal spraying step in a method for manufacturing a stage according to an embodiment of the present invention.

FIGS. 4, 5, and 6 show schematic perspective views explaining the first thermal spraying step (S110), the second thermal spraying step (S120), and the third thermal spraying step (S130), respectively, in the method for manufacturing the stage 100 according to an embodiment of the present invention.

In the first thermal spraying step (S110), as shown in FIG. 4, a thermal spraying machine 500 including a thermal spraying apparatus is moved in one direction from one end of the base material 110 to the other end of the base material 110 along a plane substantially parallel to the top surface 101 of the base material 110 while rotating the base material 110. The first layer 121 is formed on the top surface 101 of the base material 110 by the thermal spraying material which is blown out from the thermal spraying machine 500. The distance (thermal spraying distance) between the top surface 101 of the base material 110 and the thermal spraying machine 500 is, for example, greater than or equal to 60 mm and less than or equal to 130 nm. When the thermal spraying distance is small, the energy of the thermal spraying material adhering to the base material 110 is large, so that oxygen vacancies are likely to be generated in the case where an oxide is used as the thermal spraying material. Further, when the thermal spraying distance is large, it is difficult to form a dense film. Therefore, the thermal spraying distance is preferably within the above range. In addition, it is preferable that the thermal spraying machine 500 passes through the center of rotation of the base material 110 so that the thickness of the first layer 121 is uniform.

The thermal spraying machine 500 may be moved in one direction from the center of rotation of the base material 110 to the other end of the base material 110. Further, the thermal spraying machine 500 may be moved not only in one direction but also back and forth. Furthermore, when the direction in which the thermal spraying machine 500 blows out the thermal spraying material is defined as the thermal spraying direction, the thermal spraying direction may be a direction perpendicular to the top surface 101 of the base material 110 or a direction having a certain angle from the perpendicular direction. That is, when the direction perpendicular to the top surface 101 of the base material 110 is 0°, the thermal spraying direction may be 0° or may be a direction other than 0°. The thermal spraying direction other than 0° is, for example, greater than 0° and less than or equal to 10°. By changing the angle of the thermal spraying direction, the thickness of the first layer 121 formed on the top surface 101 of the base material 110 can be adjusted by one movement of the thermal spraying machine 500.

When the thermal spraying machine 500 is moved from one end of the base material 110 to the other end of the base material 110, the thermal spraying material blown out from the thermal spraying machine 500 also reaches the first surface 111 of the step portion 150. Thus, the first layer 121 is formed not only on the top surface 101 of the base material 110 but also on the first surface 111.

Next, the second thermal spraying step (S120) is performed. In the second thermal spraying step (S120), as shown in FIG. 5, the thermal spraying machine 500 is moved in one direction from the top end to the bottom end of the base material 110 along a plane substantially parallel to the side surface 102 of the base material 110 while rotating the base material 110. The second layer 122 is formed on the side surface 102 of the base material 110 by the thermal spraying material blown out from the thermal spraying machine 500. The distance between the side surface 102 of the base material 110 and the thermal spraying machine 500 is preferably greater than or equal to 60 mm and less than or equal to 130 mm.

The thermal spraying machine 500 may be moved in one direction from the bottom end of the base material 110 to the top end of the base material 110. Further, the thermal spraying machine 500 may be moved not only in one direction but also back and forth. Furthermore, the thermal spraying direction may be a direction perpendicular to the side surface 102 of the base material 110 or a direction having a certain angle from the perpendicular direction. That is, when the direction perpendicular to the side surface 102 of the base material 110 is 0°, the thermal spraying direction may be 0° or may be a direction other than 0°. The thermal spraying direction other than 0° is, for example, greater than 0° and less than or equal to 10°. By changing the angle of the spraying direction, the thickness of the second layer 122 formed on the side surface 102 of the base material 110 can be adjusted by one movement of the spraying machine 500. The angle of the thermal spraying direction in the second thermal spraying step (S120) may be the same as or different from the angle of the thermal spraying direction in the first thermal spraying step (S110).

When the thermal spraying machine 500 is moved from the upper end to the lower end of the base material 110, the thermal spraying material blown out from the thermal spraying machine 500 also reaches the second surface 112 of the step portion 150. Thus, the second layer 122 is formed not only on the side surface 102 of the base material 110 but also on the second surface 112.

Next, the third thermal spraying step (S120) is performed. In the third thermal spraying step (S130), as shown in FIG. 6, the thermal spraying machine 500 is moved in one direction from one end to the other end of the base material 110 along a plane substantially parallel to the bottom surface 103 of the base material 110 while rotating the base material 110. The third layer 123 is formed on the bottom surface 103 of the base material 110 by the thermal spraying material which is blown out from the thermal spraying machine 500. The distance between the bottom surface 103 of the base material 110 and the thermal spraying machine 500 is preferably greater than or equal to 60 mm and less than or equal to 130 mm.

The third layer 123 may be formed on a part of the bottom surface 103 of the base material 110. That is, the thermal spraying machine 500 may move in one direction from one end to the other end of the part of the bottom surface 103 of the base material 110 rather than the whole bottom surface 103. Further, the thermal spraying machine 500 may be moved not only in one direction but also back and forth. Furthermore, the thermal spraying direction may be a direction perpendicular to the bottom surface 103 of the base material 110 or a direction having a certain angle from the perpendicular direction. That is, when the direction perpendicular to the bottom surface 102 of the base material 110 is 0°, the thermal spraying direction may be 0° or may be a direct other than 0°. The thermal spraying direction other than 0° is, for example, greater than 0° and less than or equal to 10°. By changing the angle of the spraying direction, the thickness of the third layer 123 formed on the bottom surface 103 of the base material 110 can be adjusted by one movement of the spraying machine 500. The angle of the thermal spraying direction in the third thermal spraying step (S130) may be the same as or different from the angle of the thermal spraying direction in the first thermal spraying step (S110) or the second thermal spraying step (S120).

When the first thermal spraying step (S110), the second thermal spraying step (S120), and the third thermal spraying step (S130) are included in one cycle, the stage 100 is manufactured by repeating at least two cycles. In the step portion 150, since one first layer 121 and one second layer 122 are formed in one cycle, a plurality of first layers 121 and a plurality of second layers 122 are formed by multiple cycles.

Figure 7A:
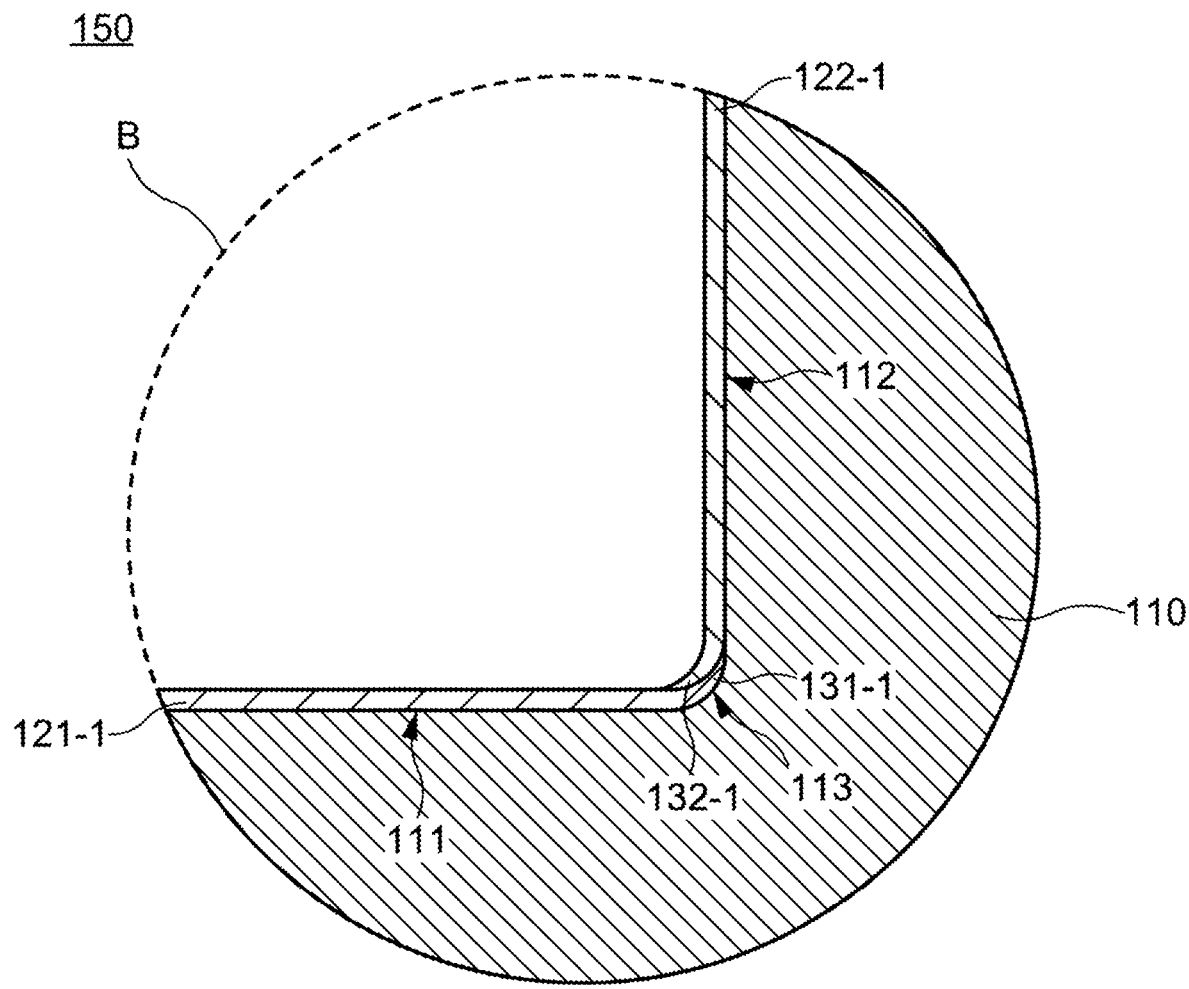
FIG. 7A is a schematic cross-sectional view showing an enlarged part of a step portion of a stage according to an embodiment of the present invention.
Figure 7B:
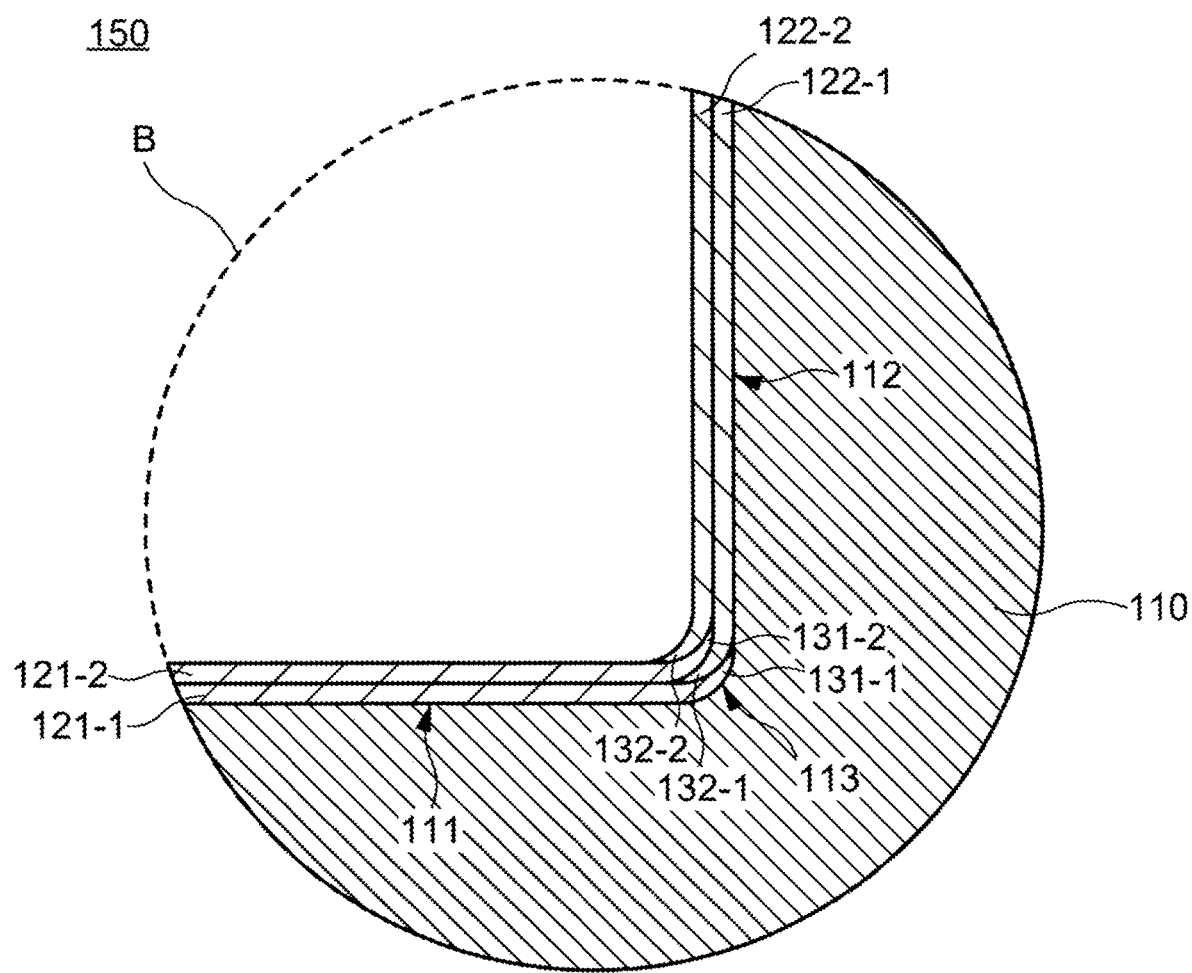
FIG. 7B is a schematic cross-sectional view showing an enlarged part of a step portion of a stage according to an embodiment of the present invention.

FIGS. 7A and 7B are schematic cross-sectional views showing an enlarged part of the step portion 150 of the stage 100 according to an embodiment of the present invention. Specifically, FIG. 7A is an enlarged cross-sectional view of the step portion 150 corresponding to region B shown in FIG. 1B after one cycle, and FIG. 7B is an enlarged cross-sectional view of the step portion 150 corresponding to region B shown in FIG. 1B after two cycles. For the sake of convenience, although the following description assumes that the corner 113 of the step portion 150 is R-chamfered, the same configuration is applied to the corner 113 being C-chamfered.

In the first thermal spraying step (S110) of the first cycle, the first layer 121-1 is formed on the top surface 101 and the first surface 111 of the base material 110. Since the thermal spraying direction of the thermal spraying machine 500 is substantially parallel to the second surface 112, the thermal spraying material blown out from the thermal spraying machine 500 does not reach the second surface 112. Therefore, the first layer 121-1 is hardly formed on the second surface 112, and the first layer 121-1 is selectively formed on the first surface 111. Further, at the corner 113, the arrival amount of the thermal spraying material blown out from the thermal spraying machine 500 is reduced from the first surface 111 toward the second surface 112. Therefore, at the corner 113, the thickness of the first layer 121-1 decreases as the arrival amount of the thermal spray material is reduced, and the first end portion 131-1 is formed so as to rise in a convex shape with respect to the first surface 111 and incline with respect to the first surface 111.

In the second thermal spraying step (S110) of the first cycle, the second layer 122-1 is formed on the side surface 102 and the second surface 112 of the base material 110. Since the thermal spraying direction of the thermal spraying machine 500 is substantially parallel to the first surface 111, the thermal spraying material blown out from the thermal spraying machine 500 does not reach the first surface 111. Therefore, the second layer 121-1 is hardly formed on the first surface 111, and the second layer 122-1 is selectively formed on the second surface 112. Further, at the corner 113, the arrival amount of the thermal spraying material blown out from the thermal spraying machine 500 is reduced from the second surface 112 toward the first surface 111. Therefore, at the corner 113, the thickness of the second layer 122-1 decreases as the arrival amount of the thermal spray material is reduced, and the second end portion 132-1 is formed so as to rise in a convex shape with respect to the second surface 112 and incline with respect to the second surface 112. In addition, the second end portion 132-1 is formed on the first end portion 131-1. That is, the second end portion 132-1 overlaps the first end portion 131-1 at the corner 113.

The same configuration is applied to the second cycle. The first layer 121-2 is selectively formed over the first surface 111 in the first thermal spraying step (S110), and the second layer 121-2 is selectively formed over the second surface 112 in the second thermal spraying step (S120). As a result, two layers of the first layer 121 are formed on the first surface 111 and two layers of the second layer 122 are formed on the second surface 112 by two cycles. Further, at the corner 113, the first end portion 131-2 and the second end portion 132-2 are formed by the second cycle. As a result, by two cycles, the structure in which the first end portion 131-1, the second end portion 132-1, the first end portion 131-2, and the second end portion 132-2 are stacked in order is formed at the corner 113.

The insulating film 120 including the plurality of first layers 121 and the plurality of second layers 122 is formed at the step portion 150 by repeating the cycle multiple times. Further, the structure in which the first end portion 131 and the second end portion 132 are alternately stacked is formed at the corner 113 of the step portion 150.

The cycle of the thermal spraying process is not limited to the order of the first thermal spraying step (S110), the second thermal spraying step (S120), and the third thermal spraying step (S130). The cycle of the thermal spraying process may be in the order of the third thermal spraying step (S130), the second thermal spraying step (S120), and the first thermal spraying step (S110).

Although the first thermal spraying step (S110) and the second thermal spraying step (S120) include thermal spraying to the step portion 150, the third thermal spraying step (S130) does not include thermal spraying to the step portion 150. Therefore, the cycle of the thermal spraying process may include the first thermal spraying step (S110) and the second thermal spraying step (S120). In this case, before and after repeating the first thermal spraying step (S110) and the second thermal spraying step (S120), only the third thermal spraying step (S130) may be performed separately. In the third thermal spraying step (S130) performed separately from the cycle, the thermal spraying machine 500 may be moved back and forth multiple times.

With respect to the movement of the thermal spraying machine 500, the thermal spraying machine 500 may be moved in a zigzag pattern without rotating the base material 110.

In the method for manufacturing the stage 100 according to the present embodiment, the insulating film 120 having the structure in which the first end portions 131 of the first layers 121 and the second end portions 132 of the second layers 122 are alternately stacked is formed at the corner 113 of the step portion 150. Since the first end portion 131 and the second end portion 132 are formed to have a small thickness, the thickness t3 of the insulating film 120 at the corner 113 is controlled to be 100% to 200% of each of the thickness t1 of the insulating film 120 on the first surface 111 and the thickness t2 of the insulating film 120 on the second surface 112. As a result, the insulating film 120 at the corner 113 can have adhesion strength comparable to the insulating film 120 on the first surface 111 and the second surface 112. Further, since the thickness of the insulating film 120 is uniform in the step portion 150, the insulating film 120 does not include large gaps. In particular, the insulating film 120 at the corner portion 113 has the structure in which the first end portions 131 of the first layers 121 and the second end portions 132 of the second layers 122 are alternately stacked, and the insulating film 120 at the corner 113 is a dense film and is less likely to contain large gaps or voids. Thus, the withstand voltage of the insulating film 120 is improved. Therefore, in the method for manufacturing the stage 100 according to the present embodiment, even when the base material 110 of the stage 100 has the step portion 150, the insulating film 120 with improved adhesion strength and withstand voltage can be formed. Accordingly, the stage 100 with excellent insulation properties and reliability can be manufactured.

Modification 1

A configuration of an insulating film 120A, which is a modification of the insulating film 120 of the stage 100 according to the First Embodiment, is described with reference to FIGS. 8 and 9. Hereinafter, descriptions of the configurations similar to those of the stage 100 of the First Embodiment described above may be omitted.

Figure 8:
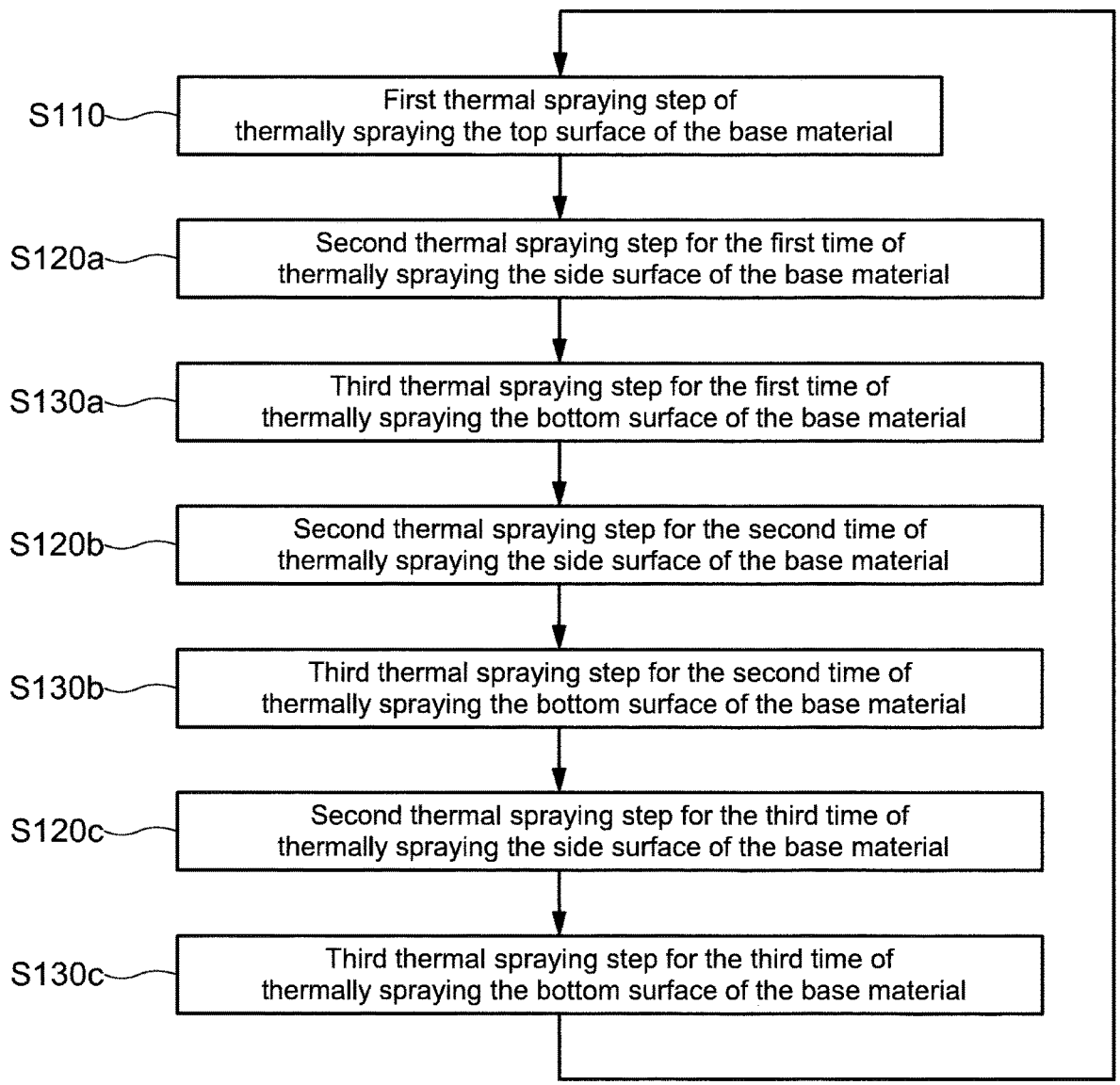
FIG. 8 is a flow chart showing a method for manufacturing a stage according to an embodiment of the present invention.

FIG. 8 is a flow chart showing a method of manufacturing the stage 100 according to an embodiment of the present invention. Specifically, FIG. 8 is a flow chart of a thermal spraying process, which is one of the manufacturing processes of the stage 100.

In the method for manufacturing the stage 100 described with reference to FIG. 3, an example is described in which each of the first thermal spraying step (S110) to the third thermal spraying step (S130) is performed once in one cycle. However, the method of manufacturing the stage 100 is not limited to this configuration. Each of the first thermal spraying step (S110) to the third thermal spraying step (S130) may be performed multiple times in one cycle. Further, the first thermal spraying step (S110) to the third thermal spraying step (S130) performed in one cycle may be performed the same or a different number of times. The thickness of each of the layers formed in the first thermal spraying step (S110) to the third thermal spraying step (S130) may be different due to the difference of the distance between the base material 110 and the thermal spraying machine 150 in the first thermal spraying step (S110) to the third thermal spraying step (S130), the moving speed of the thermal spraying machine 150, or the angle of the thermal spraying direction. In this case, the number of the first thermal spraying step (S110) to the third thermal spraying step (S130) performed in one cycle may be adjusted.

For example, when the thickness of the layer formed in the first thermal spraying step (S110) is three times the thickness of each of the layers formed in the second thermal spraying step (S120) and the third thermal spraying step (S130), one cycle which includes one first thermal spraying step (S110), three second thermal spraying steps (S120*a* to S120*c*), and three third thermal spraying steps (S130*a* to S130*c*) can be performed as shown in FIG. 8. Specifically, the second thermal spraying step (S120*a*) and the third thermal spraying step (S130*a*) are performed for the first time after the first thermal spraying step (S110). Subsequently, the second thermal spraying step (S120*b*) and the third thermal spraying step (S130*b*) are performed for the second time, then, the second thermal spraying step (S120*c*) and the third thermal spraying step (S130*c*) are performed for the third time.

Figure 9:
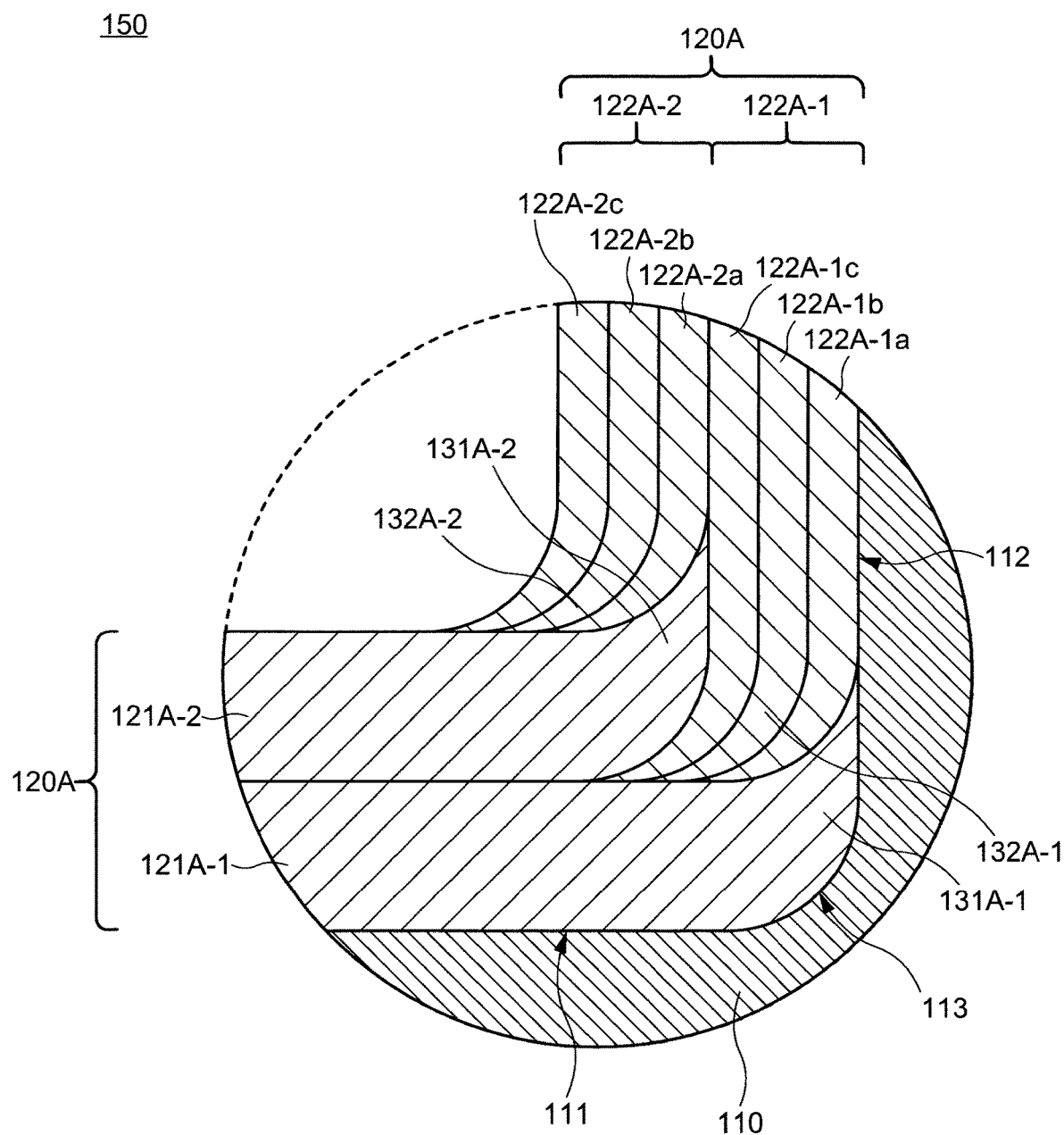
FIG. 9 is a schematic cross-sectional view showing an enlarged part of a step portion of a stage according to an embodiment of the present invention.

FIG. 9 is a schematic cross-sectional view showing an enlarged part of the step portion 150 of the stage 100 according to an embodiment of the present invention. Specifically, FIG. 9 is a cross-sectional view of the step portion 150 of the stage 100 that is manufactured by repeating the thermal spraying process shown in FIG. 8 in two cycles.

As shown in FIG. 9, the insulating film 120A on the first surface 111 includes a plurality of first layers 121A. That is, the stacked first layers 121A-1 and 121A-2 are provided on the first surface 111. The insulating film 120A on the second surface 112 includes a plurality of second layers 122A. That is, the stacked second layers 122A-1 and 122A-2 are provided on the second surface 112. Further, each of the second layers 122A-1 and 122A-2 has a stacked structure (or layered structure). Specifically, the second layer 122A-1 has the stacked structure including three layers 122A-1*a*, 122A-1*b*, and 122A-1*c*, and the second layer 122A-2 has the stacked structure including three layers 122A-2*a*, 122A-2*b*, and 122A-2*c*.

The first layers 121A-1 and 121A-2 are respectively formed by the first thermal spraying step (S110) in the first cycle and the first thermal spraying step (S110) in the second cycle. Further, since the arrival amount of the thermal spray material blown out from the thermal spraying machine 500 is reduced at the corner 113, the thickness of each of the first layers 121A-1 and 121A-2 decreases. Therefore, the first end portions 131A-1 and 131A-2 are formed at the corner 113 by the first cycle and the second cycle, respectively.

In the first cycle, the three layers 122A-1*a*, 122A-1*b*, and 122A-1*c* included in the second layer 122A-1 are formed in the second thermal spraying step for the first time (S120*a*), the second thermal spraying step for the second time (S120*b*), and the second thermal spraying step for the third time (S120*c*), respectively. Further, in the second cycle, the three layers 122A-2*a*, 122A-2*b*, and 122A-2*c* included in the second layer 122A-2 are formed in the second thermal spraying step for the first time (S120*a*), the second thermal spraying step for the second time (S120*b*), and the second thermal spraying step for the third time (S120*c*), respectively.

Here, the formation of the stacked structure of the second layer 122A is described. Although the third thermal spraying step for the first time (S130*a*) is performed after the second thermal spraying step for the first time (S120*a*), the third thermal spraying step for the first time (S130*a*) is not a thermal spraying process for the step portion 150. Therefore, no layer is formed in the step portion 150 in the third thermal spraying step for the first time (S130*a*). The same configuration is applied to the third thermal spraying step for the second time (S130b) and the third thermal spraying step for the third time (S130c). Thus, three second thermal spraying steps (S120a to S120c) in the first cycle form the stacked structure in which the three layers 122A-1a, 122A-1b, and 122A-1c are stacked in order. Further, three second thermal spraying steps (S120a to S120c) in the second cycle form the stacked structure in which the three layers 122A-2a, 122A-2b, and 122A-2c are stacked in order. Since the arrival amount of thermal spray material blown out from the thermal spraying machine 500 at the corner 113 is reduced, the second end portions 132A-1 and 132A-2 are formed at the corner 113 by the first cycle and the second cycle, respectively. Also, the second end portions 132A-1 and 132A-2 have a stacked structure.

Although an example in which the second end portion 132A has a stacked structure is described above, the insulating film 120A may have a structure in which at least one of the first end portion 131A and the second end portion 132A has a stacked structure.

When the cycle is repeated multiple times, a structure in which the first end 131A and the second end 132A are alternately stacked is formed at the corner 113. Further, by adjusting the number of times the first thermal spraying step (S110) and the second thermal spraying step (S120) are performed in one cycle, the insulating film 120A with uniform thickness can be formed on the first surface 111 and the second surface 112. Furthermore, the thickness of the insulating film 120A at the corner 113 can be controlled.

The insulating film 120A according to this modification has the structure in which the first end portions 131A of the first layers 121A and the second end portions 132A of the second layers 122A are alternately stacked at the corner 113. In addition, since at least one of the first end portion 131A and the second end portion 132A has the stacked structure, the insulating film 120A is a dense film and is less likely to contain large gaps or voids. Therefore, the withstand voltage of the insulating film 120A is improved. Therefore, the stage 100 including insulating film 120A has excellent insulating properties and reliability.

Second Embodiment

Configurations of a stage 200 according to an embodiment of the present invention and a stage 200A that is a modification thereof are described with reference to FIGS. 10A and 10B. Hereinafter, descriptions of the configurations of the stage 200 and the stage 200A that are similar to the configuration of the stage 100 according to the First Embodiment may be omitted.

Figure 10A:
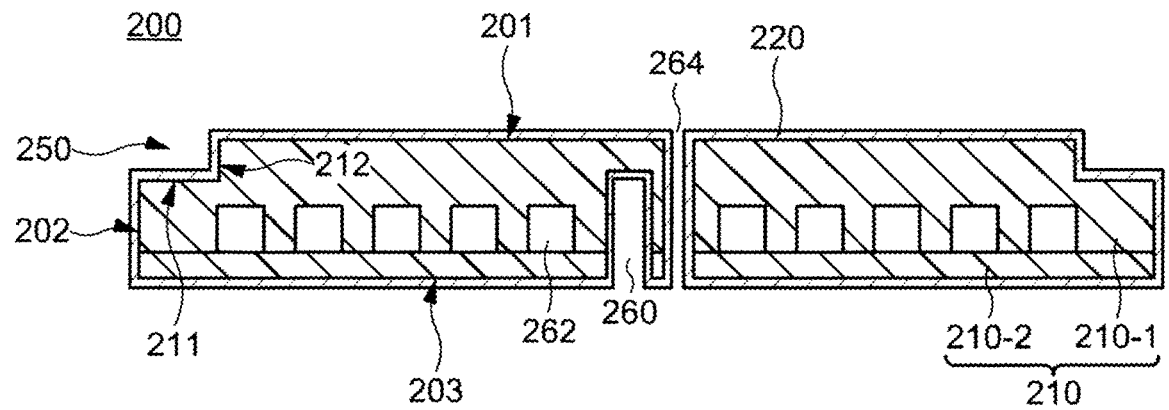
FIG. 10A is a schematic cross-sectional view of a stage according to an embodiment of the present invention.
Figure 10B:
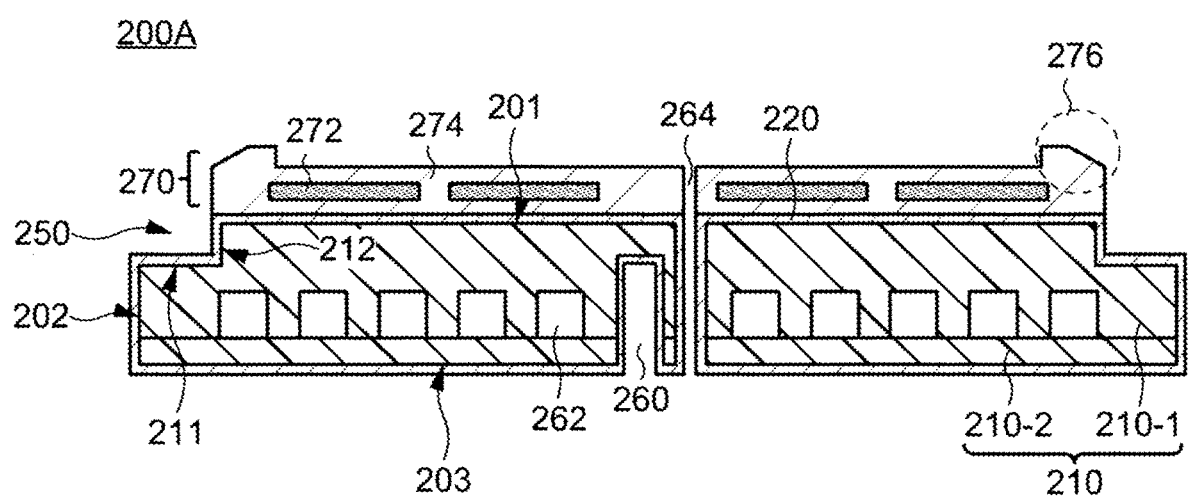
FIG. 10B is a schematic cross-sectional view of a stage according to an embodiment of the present invention.

FIGS. 10A and 10B are schematic cross-sectional views of the stage 200 and the stage 200A according to an embodiment of the present invention.

As shown in FIG. 10A, the stage 200 includes a base material 210 and an insulating film 220. The base material 210 includes a first base material 210-1 and a second base material 210-2. The insulating film 220 is provided so as to cover a top surface 201 (a top surface 201 of the first base material 201-1), a side surface 202 (side surfaces 202 of the first base material 210-1 and the second base material 210-2), and a bottom surface 203 (a bottom surface 203 of the second base material 210-2) of the base material 210. Also, the insulating film 220 may be provided so as to cover the whole top surface 201, the whole side surface 202, or the whole bottom surface 203 of the base material 210, or may be provided on a part of the top surface 201, a part of the side surface 202, or a part of the bottom surface 203 of the base material 210.

The base material 210 (more specifically, the first base material 210-1) includes a step portion 250 having a first surface 211 recessed from the top surface 201 and a second surface 212 recessed from the side surface 202. The insulating film 220 is also provided on the first surface 211 and the second surface 212 of the step portion 250.

The insulating film 220 is formed by the thermal spraying method similar to that for the insulating film 120 of the First Embodiment. Therefore, the insulating film 220 with improved adhesion strength and withstand voltage is formed on the base material 210. Further, the configuration of the step portion 250 of the stage 200 is the same as the configuration of the step portion 150 of the stage 100 according to the First Embodiment. Therefore, the decrease in adhesion strength of the insulating film 220 at the corner of the step portion 250 is suppressed. Furthermore, at the step portion 250, the insulating film 220 has a uniform thickness and does not contain large gaps or voids. Therefore, the withstand voltage of the insulating film 220 is improved.

An opening 260 is provided in the bottom surface 203 of the base material 210. For example, a temperature sensor such as a thermocouple can be installed in the opening 260. The insulating film 220 may be provided on the whole inner wall of the opening 260 or may be provided on a part of the inner wall of the opening 260.

A groove (flow path) 262 may be provided inside the base material 210 for recirculating a medium for controlling the temperature of a substrate which is placed on the stage 200. Water, alcohol such as isopropanol or ethylene glycol, or a liquid medium such as silicone oil can be used as the medium. The groove 262 is formed in one or both of the first base material 210-1 and the second base material 210-2, and then the first base material 210-1 and the second base material 210-2 are joined by brazing or the like. The medium can be used in both cases when the stage 200 is cooled or heated. The temperature of the stage 200 can be controlled by flowing the medium whose temperature is controlled by a temperature controller 328 shown in FIG. 13, which is described later.

Further, the stage 200 may have a through hole 264 penetrating through the base material 210. The number of through holes 264 is not limited to one, and may be a plurality. For example, a gas introduction tube can be provided in the chamber 302 shown in FIG. 13, which is described later, and a gas supplied from the gas introduction tube can be introduced to the through hole 264. By introducing a gas with high thermal conductivity such as helium through the through hole 264, the gas flows through the gap between the stage 200 and the substrate, and the thermal energy of the stage 200 can be efficiently transferred to the substrate. The insulating film 220 may be provided on the whole inner wall of the through hole 264 or may be provided on a part of the inner wall of the through hole 264.

The stage 200A shown in FIG. 10B further includes an electrostatic chuck 270 as a mechanism for fixing the substrate on the stage 200A. The electrostatic chuck 270 may have a structure in which, for example, electrostatic chuck electrodes 272 are covered with an insulating film 274. By applying a high voltage (several hundred volts to several thousand volts) to the electrostatic chuck electrodes 272, it is possible to fix the substrate due to a Coulomb force between a charge generated in the electrostatic chuck electrodes 272 and a charge generated on the back surface of the substrate and having the opposite polarity to the charge generated in the electrostatic chuck electrodes 272. A ceramic such as aluminum oxide, aluminum nitride, or boron nitride can be used as the insulator of the insulating film 274. The insulating film 274 does not have to be completely insulated and may have some degree of conductivity (e.g., resistance ratio in the order of 109 Ωcm to 1012 Ωcm). In this case, the above-described ceramic is doped with a metal oxide such as titanium oxide, zirconium oxide, or hafnium oxide to form the insulating film 274. A rib 276 may be provided around the electrostatic chuck 270 to determine the position of the substrate.

The electrostatic chuck 270 can be joined to the insulating film 220 on the top surface of the base material 210 by, for example, welding, screwing, or brazing. An alloy containing silver, copper and zinc, an alloy containing copper and zinc, copper containing a small amount of phosphorus, aluminum and an alloy of copper containing a small amount of phosphorus, an alloy containing titanium, copper and nickel, an alloy containing titanium, zirconium, and copper, or an alloy containing titanium, zirconium, copper, and nickel, or the like can be used as the braze in brazing.

In the stage 200 or stage 200A according to the present embodiment, the decrease in the adhesion strength of the insulating film 220 at the corner of the step portion 250 is suppressed, and the adhesion strength of the insulating film 220 is improved. In addition, in the step portion 250, the insulating film 220 has a uniform thickness and does not contain large gaps or voids. Thus, the withstand voltage of the insulating film 220 is improved. Therefore, the stage 200 or 200A according to the present embodiment includes the insulating film 220 with improved adhesion strength and withstand voltage, and has excellent insulating properties and reliability.

Modification 2

A stage 200B and a stage 200C, which are further modifications of the stage 200 according to an embodiment of the present invention, are described with reference to FIGS. 11A, 11B, and 12. Hereinafter, descriptions of the configurations of the stage 200B and the stage 200C that are similar to the configuration of the stage 200 or the stage 200A according to the Second Embodiment may be omitted.

Figure 11A:
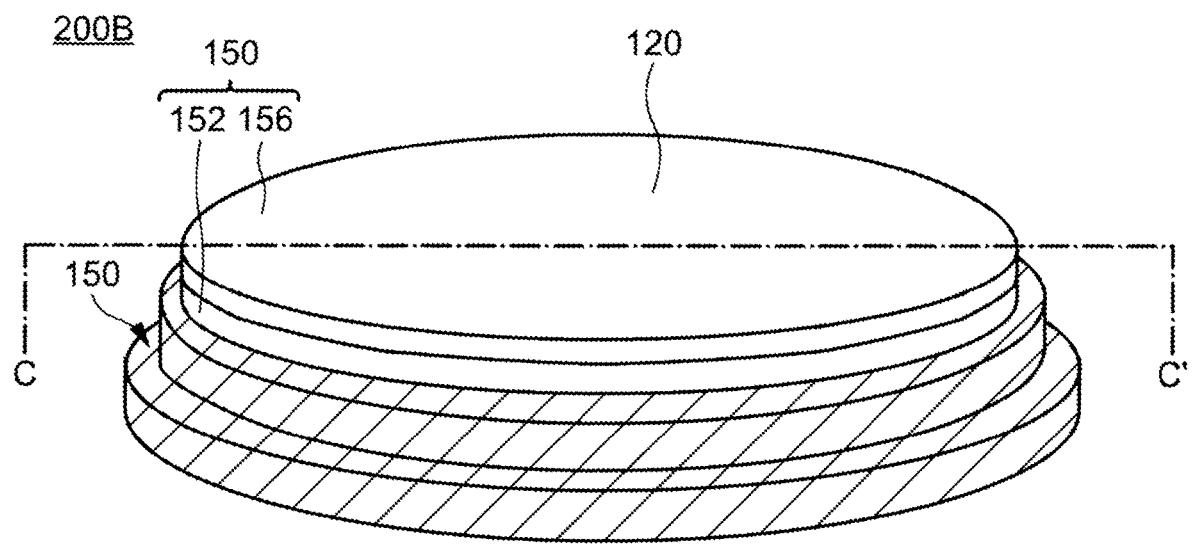
FIG. 11A is a schematic cross-sectional view of a stage according to an embodiment of the present invention.
Figure 11B:
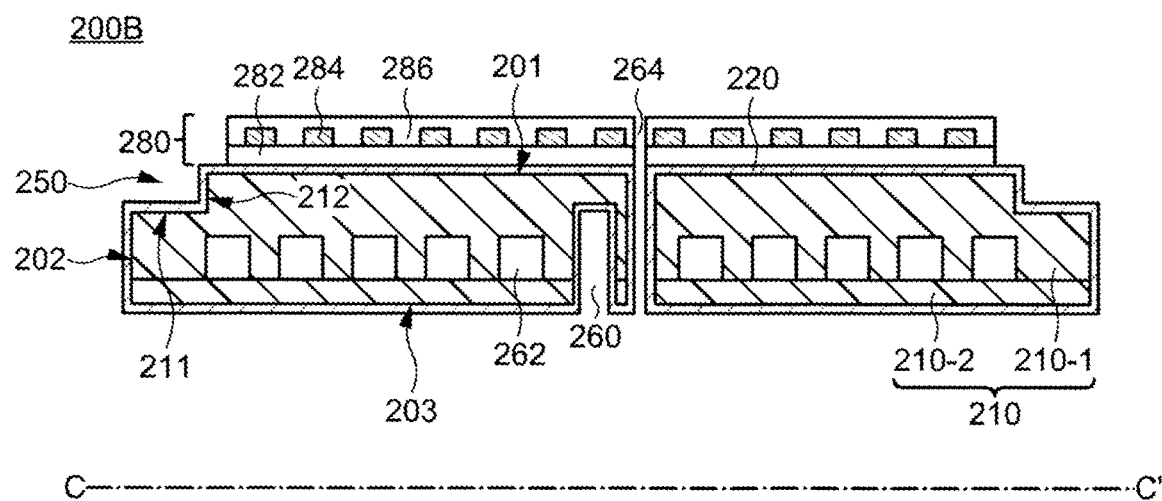
FIG. 11B is a schematic cross-sectional view of a stage according to an embodiment of the present invention.

FIGS. 11A and 11B are a schematic perspective view and a cross-sectional view of a stage 200B, respectively, according to an embodiment of the present invention. Specifically, FIG. 11A is a schematic perspective view of stage 200B, and FIG. 11B is a schematic cross-sectional view of stage 200B cut along the line C-C' shown in FIG. 11A.

As shown in FIGS. 11A and 11B, the stage 200B includes a base material 210, an insulating film 220, and a heater layer 280. That is, the configuration of the stage 200B differs from the configuration of stage 200 in that the heater layer 280 is included. The heater layer 280 is provided on the insulating film 220 which is provided on the top surface 201 of the base material 210.

In the stage 200B, the temperature of the stage 200B can be controlled by flowing the medium whose temperature is controlled by the temperature controller 328 shown in FIG. 13, which is described later, through the groove 262. However, the response of temperature control by a liquid medium is slow, and precise temperature control is relatively difficult. Therefore, it is preferable to roughly control the temperature of the stage 200B using the medium and precisely control the temperature of the substrate by using a heater wire 284 in the heater layer 280. This enables not only precise temperature control but also temperature adjustment of the stage 200B at high speed.

The heater layer 280 includes three layers. Specifically, the heater layer 280 includes a first insulating film 282, a heater wire 284 over the first insulating film 282, and a second insulating film 286 over the heater wire 284. The heater wire 284 is electrically insulated by the first insulating film 282 and the second insulating film 286. In the heater layer 280, one heater wire 284 may be provided or a plurality of heater wires 284 may be provided. When a plurality of heater wires 284 are provided in the heater layer 280, each of the plurality of heater wires 284 may be independently controlled by a heater power supply 330 shown in FIG. 13, which is described later. The heater wire 284 is heated by power supplied from the heater power supply 330, thereby controlling the temperature of the stage 200B.

The first insulating film 282 and the second insulating film 286 can include an inorganic insulator. Since the inorganic insulator is described in the First Embodiment, the description thereof is omitted here. Further, the first insulating film 282 and the second insulating film 286 can be formed using the thermal spraying method. Since the thermal spraying method is described in the First Embodiment, the description thereof is omitted here.

The heater wire 284 can contain a metal that generates heat by electric conduction. Specifically, the heater wire 284 may include a metal selected from tungsten, nickel, chromium, cobalt, and molybdenum. The metal may be an alloy containing these metals, for example, an alloy of nickel and chromium, or an alloy containing nickel, chromium, and cobalt.

The heater wire 284 is preferably formed by disposing a metal film formed by a sputtering method, an organometallic CVD (MOCVD) method, an evaporation method, a printing method, an electroplating method, or the like, or a metal foil processed separately by etching on the first insulating film 282. When forming the heater wire 284 using the thermal spraying method, it is difficult to ensure a uniform density, thickness, and width over the whole heater wire 284, whereas, in the case of the metal film or the metal foil, it is possible to form the small heater wire 284 having small variations in these physical parameters. This makes it possible to precisely control the temperature of the stage 200B and reduce the temperature distribution.

Furthermore, since the alloy described above has a higher volume resistivity as compared with a metal alone, in the case when the planar shape (the layout of the heater wire 284) is the same, it is possible to increase the thickness of the heater wire 284 as compared with the case of using a metal alone. Therefore, it is possible to reduce the variation in the thickness of the heater wire 284, and it is possible to realize a smaller temperature distribution.

Figure 12:
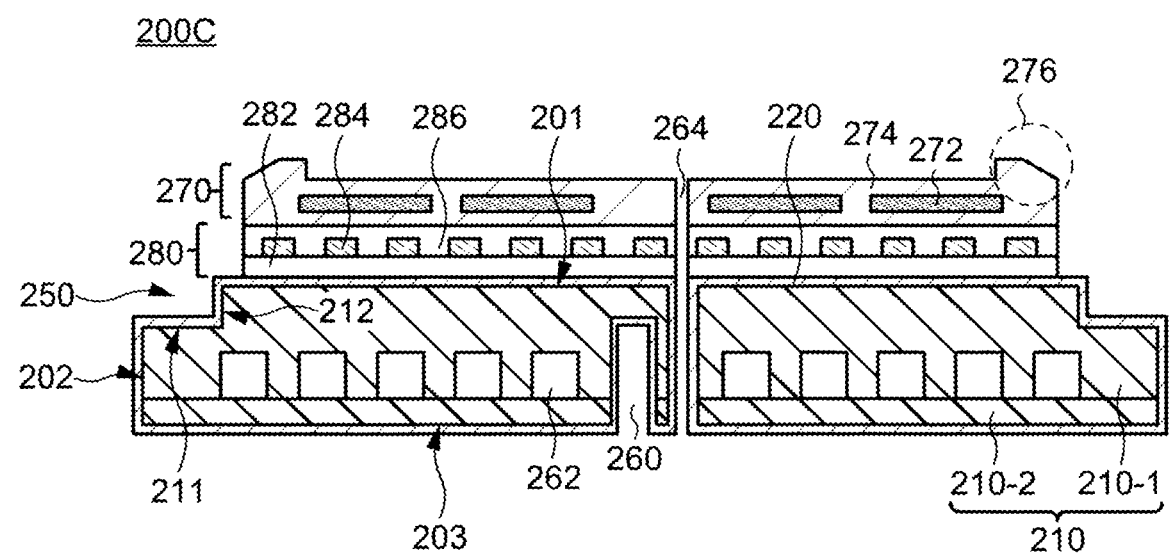
FIG. 12 is a schematic cross-sectional view of a stage according to an embodiment of the present invention.

FIG. 12 is a schematic cross-sectional view of a stage 200C according to an embodiment of the present invention. The stage 200C shown in FIG. 12 further includes the electrostatic chuck 270 as a mechanism for fixing the substrate on the stage 200C. Since the electrostatic chuck 270 has the same configuration as described above, the description thereof is omitted here.

In the stage 200B or stage 200C according to the present embodiment, the decrease in the adhesion strength of the insulating film 220 at the corner of the step portion 250 is suppressed, and the adhesion strength of the insulating film 220 is improved. In addition, in the step portion 250, the insulating film 220 has a uniform thickness and does not contain large gaps or voids. Thus, the withstand voltage of the insulating film 220 is improved. Therefore, the stage 200B or 200C according to the present embodiment includes the insulating film 220 with improved adhesion strength and withstand voltage, and has excellent insulating properties and reliability.

Third Embodiment

A configuration of a film processing apparatus 300 according to an embodiment of the present invention is described with reference to FIG. 13. The film processing apparatus 300 includes a stage 100. Therefore, the description of the configuration of the stage 100 according to the First Embodiment may be omitted here.

Figure 13:
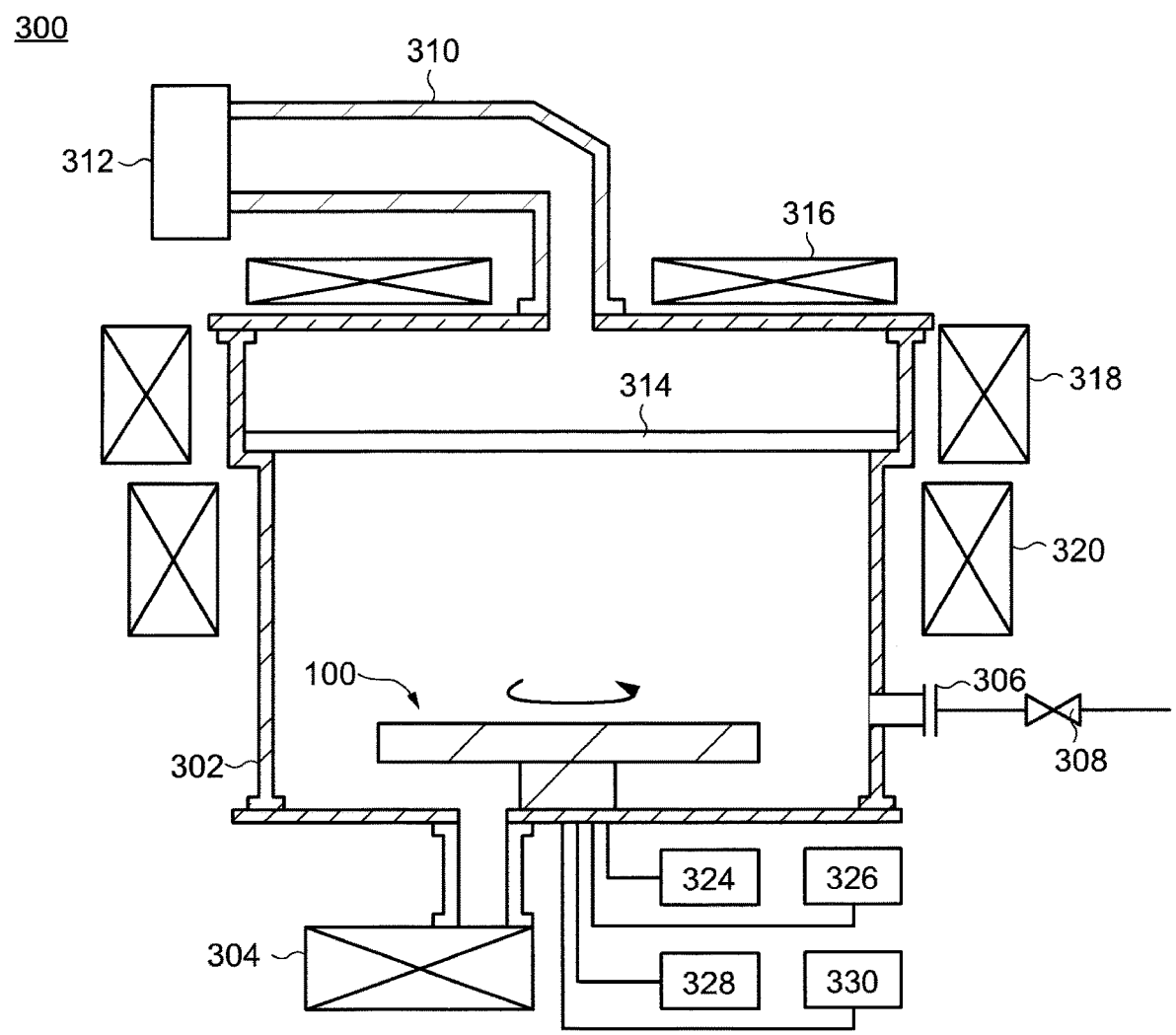
FIG. 13 is a schematic cross-sectional view of a film processing apparatus including a stage according to an embodiment of the present invention.

FIG. 13 is a schematic cross-sectional view of the film processing apparatus 300 according to an embodiment of the present invention. Although the film processing apparatus 300 is a so-called etching apparatus, the film processing apparatus 300 is not limited to this configuration.

The film processing apparatus 300 can perform dry etching on various films. The film processing apparatus 300 has a chamber 302. The chamber 302 provides a space for etching a film, such as a conductor, insulator, or semiconductor, formed on the substrate.

An exhaust device 304 is connected to the chamber 302, so that the inside of the chamber 302 can be set to a reduced-pressure atmosphere. The chamber 302 is further provided with an introduction tube 306 for introducing a reaction gas, and the reaction gas for etching is introduced into the chamber via a valve 308. Examples of the reaction gas include fluorine-containing organic compounds such as carbon tetrafluoride (CF4), octafluorocyclobutane (c-C4F8), decafluorocyclopentane (c-C5F10), or hexafluorobutadiene (C4F6).

A microwave source 312 may be provided at the top of the chamber 302 via a waveguide 310. The microwave source 312 has an antenna for supplying microwaves, and outputs a high-frequency microwave such as a 2.45 GHz microwave and a 13.56 MHz radio wave (RF). The microwave generated by the microwave source 312 propagates by the waveguide 310 to the top of the chamber 302 and is introduced into the chamber 302 via a window 314 containing quartz or a ceramic, or the like. The reaction gas is converted into plasma by the microwave, and etching of the film proceeds by electrons, ions, and radicals contained in the plasma.

The stage 100 is provided in a lower portion of the chamber 302 in order to arrange a substrate. A power supply 324 is connected to the stage 100, and a voltage corresponding to a high frequency power is applied to the stage 100, and an electric field produced by microwaves is formed on the surface of the stage 100 in a direction perpendicular to the substrate surface. A magnet 316, a magnet 318, and a magnet 320 can be further provided on the top and sides of the chamber 302. The magnet 316, the magnet 318, and the magnet 320 may be permanent magnets, or electromagnets having electromagnet coils. The magnet 316, the magnet 318, and the magnet 320 create magnetic field components parallel to the stage 100 and the surface of the substrate, and in conjunction with the electric field produced by microwaves, electrons in the plasma receive a Lorentz force and resonate and are bound to the stage 100 and the surface of the substrate. As a result, high-density plasmas can be generated on the surface of the substrate.

For example, a heater power supply 330 controlling the sheath heater is connected when the stage 100 is equipped with a sheath heater. The stage 100 may also be connected in any configuration to a power supply 326 for the electrostatic chuck for securing the substrate to the stage 100, the temperature controller 328 for controlling the temperature of the medium recirculated into the stage 100, and a rotating control device (not shown) for rotating the stage 100.

A film processing apparatus 300 according to the present embodiment includes the stage 100. By using the stage 100, the substrate can be uniformly heated and the heat temperature can be precisely controlled. Further, by using the stage 100 having excellent insulating properties, the withstand voltage for the voltage applied to the substrate is improved. Therefore, by using the film processing apparatus 300, a contact having a high aspect ratio or a film having a high aspect ratio can be formed. Therefore, the film processing apparatus 300 enables uniform etching of the various films provided on the substrate. Furthermore, by using the stage 100 with high reliability, the frequency of the maintenance of the film processing apparatus 300 can be reduced.

Each of the embodiments described above as an embodiment of the present invention can be appropriately combined and implemented as long as they do not contradict each other. On the basis of each embodiment, those in which a person skilled in the art has appropriately added, deleted, or changed the design of the constituent elements are also included in the scope of the present invention as long as the gist of the present invention is provided.

It is understood that other operational effects different from those provided by the respective embodiments described above, or those which can be easily predicted by those skilled in the art, apparent from the description herein, are naturally brought about by the present invention.

What is claimed is:

1. A stage comprising:
    a base material comprising a step portion, the step portion comprising:
        a first surface recessed from a top surface of the base material; and
        a second surface recessed from a side surface of the base material; and
    an insulating film comprising a plurality of first layers on the first surface and a plurality of second layers on the second surface,
    wherein in the step portion, each first end portion of the plurality of first layers and each second end portion of the plurality of second layers are alternately stacked.

2. The stage according to claim 1,
    wherein the first surface and the second surface are connected via a corner, and
    each first end portion and each second end portion are alternately stacked at the corner.

3. The stage according to claim 2, wherein a thickness of the insulating film at the corner is greater than or equal to 100% and less than or equal to 200% of each of a thickness of the insulating film on the first surface and a thickness of the insulating film on the second surface.

4. The stage according to claim 2, wherein the first end portion is provided so as to rise in a convex shape and incline with respect to the first surface.

5. The stage according to claim 2, wherein the second end portion is provided so as to rise in a convex shape and incline with respect to the second surface.

6. The stage according to claim 2, wherein a cross-sectional shape of the corner in a plane perpendicular to the first surface and the second surface comprises a curved shape.

7. The stage according to claim 1, wherein at least one of the plurality of first layers and the plurality of second layers comprises a stacked structure.

8. The stage according to claim 1, wherein the base material comprises a channel for liquid flow.

9. The stage according to claim 1, wherein an electrostatic chuck is included over the insulating film on the top surface of the base material.

10. A manufacturing method of a stage, comprising the steps of:
    forming a first layer by thermal spraying from a thermal spraying machine on a first surface recessed from a top surface of a base material while moving the thermal spraying machine along a plane substantially parallel to the top surface of the base material; and
    forming a second layer by thermal spraying from the thermal spraying machine on a second surface recessed from a side surface of the base material while moving the thermal spraying machine along a plane substantially parallel to the side surface of the base material,
    wherein a cycle comprising the steps is performed at least twice, and
    an insulating film is formed in which a first end portion of the first layer and a second end portion of the second layer are alternately stacked on a step portion comprising the first surface and the second surface of the base material.

11. The manufacturing method of a stage according to claim 10, wherein the cycle further comprises a step comprising forming a third layer by thermal spraying from the thermal spraying machine on a bottom surface of the base material while moving the thermal spraying machine along a plane substantially parallel to the bottom surface of the base material.

12. The manufacturing method of a stage according to claim 10, further comprising a step comprising forming a third layer by thermal spraying from the thermal spraying machine on a bottom surface of the base material while moving the thermal spraying machine along a plane substantially parallel to the bottom surface of the base material, separately from the cycle.

13. The manufacturing method of a stage according to claim 10, wherein in the cycle, at least one of the step of forming the first layer and the step of forming the second layer is performed multiple times.

14. The manufacturing method of a stage according to claim 10, wherein in at least one of the step of forming the first layer and the step of forming the second layer, the thermal spraying machine moves in only one direction to thermally spray.

15. The manufacturing method of a stage according to claim 10, wherein in at least one of the step of forming the first layer and the step of forming the second layer, the thermal spraying machine moves in a zigzag manner to thermally spray.

16. The manufacturing method of a stage according to claim 10,
    wherein the first surface and the second surface are connected via a corner, and
    the first end portion and the second end portion are alternately stacked at the corner.

17. The manufacturing method of a stage according to claim 16, wherein a thickness of the insulating film at the corner is greater than or equal to 100% and less than or equal to 200% of each of a thickness of the insulating film on the first surface and a thickness of the insulating film on the second surface.

18. The manufacturing method of a stage according to claim 16, wherein the first end portion is provided so as to rise in a convex shape and incline with respect to the first surface.

19. The manufacturing method of a stage according to claim 16, wherein the second end portion is provided so as to rise in a convex shape and incline with respect to the second surface.

20. The manufacturing method of a stage according to claim 16, wherein a cross-sectional shape of the corner in a plane perpendicular to the first surface and the second surface comprises a curved shape.

21. The manufacturing method of a stage according to claim 10, wherein the base material comprises a channel for liquid flow.

22. The manufacturing method of a stage according to claim 10, wherein an electrostatic chuck is provided over the insulating film on the top surface of the base material.

* * * * *